US005091669A

United States Patent [19]

Mitsutsuka

[11] Patent Number: 5,091,669

[45] Date of Patent: Feb. 25, 1992

[54] SURFACE ACOUSTIC WAVE CONVOLVER

[75] Inventor: Syuichi Mitsutsuka, Tokyo, Japan

[73] Assignee: Clarion Co., Ltd., Tokyo, Japan

[21] Appl. No.: 704,328

[22] Filed: May 23, 1991

[51] Int. Cl.[5] .......... H01L 41/08

[52] U.S. Cl. .......... 310/313 A; 310/313.D

[58] Field of Search .......... 310/313 B, 313 R, 313 A, 310/313 D; 364/821

[56] References Cited

U.S. PATENT DOCUMENTS

| | | | |
|---|---|---|---|
| 4,427,913 | 1/1984 | Iafrate et al. | 310/313 B |
| 4,539,501 | 9/1985 | Trong et al. | 310/313 A |
| 4,683,395 | 7/1987 | Mitsutsuka | 310/313 R |
| 4,757,226 | 7/1988 | Mitsutsuka et al. | 310/313 A |
| 4,900,969 | 2/1990 | Mitsutsuka et al. | 310/313 A |
| 4,967,113 | 10/1990 | Mitsutsuka | 310/313 R |

OTHER PUBLICATIONS

"Integrating Acoustic Surface Wave and Silicon Transistor Technology", by R. Chicotka et al., IBM Tech. Disclosure Bulletin, vol. 13, No. 11, Apr. 1971.

"New Modes in III-V Monolithic SAW Devices", by J. Henaff et al., Inst. Phys. Conf. Ser. No. 63:Chapter 9; Int. Symp. GaAs and Related Compounds, 1981.

"New SSBW Mode in GaAs", by J. Henaff et al., 28 Apr. 1981, written for Electronics Letters, vol. 17, No. 12, 11 Jun. 1981.

*Primary Examiner*—Mark O. Budd

*Assistant Examiner*—Thomas M. Dougherty

*Attorney, Agent, or Firm*—Flynn, Thiel, Boutell & Tanis

[57] ABSTRACT

An SAW convolver having a piezoelectric film / insulating layer / low impurity concentration Si epitaxial layer / high impurity concentration Si epitaxial layer structure is disclosed, in which the low impurity concentration Si epitaxial layer is replaced by a GaAs epitaxial layer. In this way, it is possible to improve concentration characteristics with respect to those obtained by the prior art structure described above and it is unnecessary to control the thickness of the epitaxial layer so strictly as for the prior art structure.

20 Claims, 17 Drawing Sheets

SURFACE ACOUSTIC WAVE CONVOLVER

FIELD OF THE INVENTION

The present invention relates to improvement of a surface acoustic wave (hereinbelow abbreviated to SAW) convolver consisting of a piezoelectric film and semiconductor.

BACKGROUND OF THE INVENTION

FIGS. 9 and 10 are cross-sectional views showing the structure of two different prior art monolithic SAW convolvers, in which reference numeral 1 is a high impurity concentration semiconductor substrate; 2 is an insulating layer; 3 is a piezoelectric film; 4 is a gate electrode; 5 is interdigital electrodes of an input transducer; 6 is a rear electrode; 7 is an input terminal; 8 is an output terminal; 9 is a high impurity concentration semiconductor substrate; and 10 is a low impurity concentration semiconductor epitaxial layer.

That is, the device indicated in FIG. 9 is characterized by a piezoelectric film/insulator/semiconductor structure and the device indicated in FIG. 10 by a piezoelectric film/insulator/low impurity concentration semiconductor epitaxial layer/high impurity concentration semiconductor substrate structure. Further, in the structure indicated in FIG. 10, the semiconductor epitaxial layer 10 and the high impurity concentration semiconductor substrate are made of a same material. Therefore the epitaxial layer has a same lattice constant as the semiconductor substrate and thus they form a so-called homo-junction.

Comparing FIG. 9 with FIG. 10, it is known that the structure indicated in FIG. 10 has a higher convolution efficiency $F_T$ and in the present state the structure indicated in FIG. 10 is used in practice. Various characteristics of convolvers having the structure indicated in FIG. 9 are described in detail in following literatures [1] and [2];

Literature [1]

B. T. Khuri-Yakub and G. S. Kino, "A Detailed theory of the monolithic zinc oxide on silicon convolver", IEEE Trans. Sonics Ultrason., vol. SU-24, No. 1, January 1977, pp. 34–43.

Literature [2]

J. K. Elliott, et al. "A wideband SAW convolver utilizing Sezawa waves in the metal-ZnO-$SiO_2$-Si configuration", Appl. Phys. Lett. 32, May 1978, pp. 515–516.

On the other hand, various characteristics of convolvers having the structure indicated in FIG. 10 are described in detail in following literatures [3] and [4];

Literature [3]

S. Minagawa, et al. "Efficient ZnO-$SiO_2$-Si Sezawa wave convolver", IEEE Trans. Sonics Ultrason., vol. SU-32, No. 5, September 1985, pp. 670–674.

Literature [4]

U.S. Pat. No. 4,757,226

Further another structure is known, in which not the low impurity concentration epitaxial layer/high impurity concentration semiconductor substrate structure, as indicated in FIG. 10, but inversely a high impurity concentration epitaxialy layer/low impurity concentration semiconductor substrate structure, where the epitaxial layer and the substrate are made of a same material, is used instead thereof. Concerning examples of this structure, refer to following literature [5];

Literature [5]

Kuroda, et al. "Analysis of propagation characteristics of SAW in ZnO/GaAs structure (in Japanese)" Acoustic Wave Device, 131st Committee, Science Promoting Association of Japan, Report of Research Subcommittee, Jan. 26, 1983.

However the structure described in Literature [5] has a drawback that the convolution efficiency $F_T$ is as low as that of the structure indicated in FIG. 9 and that it is not practical for a convolver.

That is, in the present state, as the prior art structure, only that indicated in FIG. 10 is used in practice owing to the high convolution efficiency $F_T$ thereof. In particular, it is known that a high convolution efficiency $F_T$ is obtained, in the case where ZnO is used for the piezoelectric film and Si for the semiconductor in the structure indicated in FIG. 10 and in fact, a ZnO/$SiO_2$/n-Si epitaxial layer/$n^+$-Si substrate structure is used in practice. This structure is described in detail in Literature [3] and Literature [4] stated previously.

However there is a drawback also in the prior art structure indicated in FIG. 10. It consists in the fact that, in order to obtain a sufficiently high convolution efficiency $F_T$ of an element and good temperature characteristics thereof, it is necessary to restrict the thickness L of the epitaxial layer with respect to the maximum width of the depletion layer Wmax so as to satisfy approximately $W_{max} < L \leqq W_{max} + 2$ μm. This indicates that for Si, it is necessary to restrict the thickness L of the epitaxial layer so as to satisfy $L \lesssim$ several μm. (This point is explained in detail also in Literature [4].)

In practice, in the case where a low impurity concentration epitaxial layer is grown on a high impurity concentration Si substrate at a thickness smaller than several μm, since impurities are diffused from the high impurity concentration substrate side to the epitaxial layer, it is not easy to secure the reproducibility for the impurity concentration distribution and the thickness L of the epitaxial layer. As the result, fluctuations in characteristics of elements are great, which can be a cause of decreasing the yield of the fabrication of elements. That is, in the prior art structure, even the structure having the highest convolution efficiency $F_T$, indicated in FIG. 10, has a drawback that the yield can be decreased, if the convolution efficiency $F_T$ is increased and temperature characteristics are improved.

OBJECT OF THE INVENTION

The object of the present invention is to provide an SAW convolver having a high convolution efficiency, excellent temperature characteristics and a high fabrication yield.

SUMMARY OF THE INVENTION

In order to achieve the above object, the present invention intends to solve the problematical points described above by replacing the Si epitaxial layer in the prior art monolithic SAW convolver structure by a GaAs epitaxial layer, a Ga(1−x)AlxAs epitaxial layer or an InP epitaxial layer.

GaAs, Ga(1−x)AlxAs or InP used for the epitaxial layer in the SAW convolver structure has a mobility, which is several times as great as the mobility in Si, and therefore loss in the epitaxial layer can be reduced with respect to that observed in the prior art structure. As the result, it is possible to increase the convolution efficiency $F_T$ and to improve the temperature characteristics.

DETAILED DESCRIPTION

Figure 1:
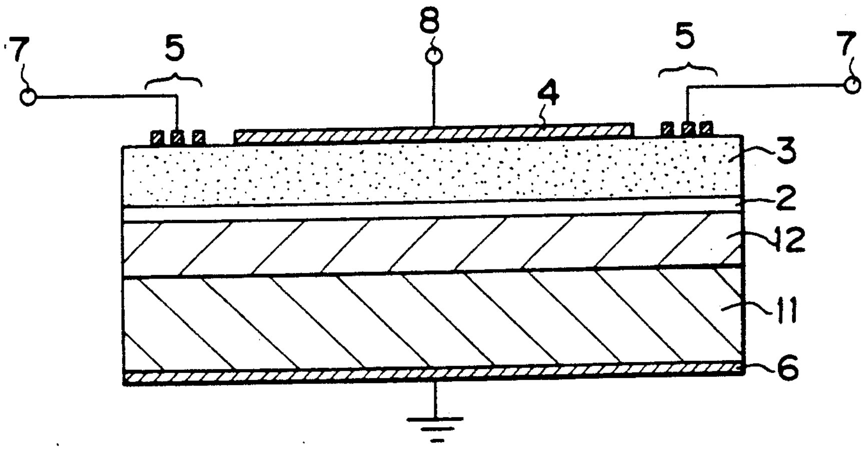
FIGS. 1, 11 and 18 are cross-sectional views of monolithic SAW convolvers, which are different embodiments of the present invention.

FIG. 1 is a cross-sectional view indicating the structure of the SAW convolver according to an embodiment of the present invention.

In the Figure, reference numeral 11 is a high impurity concentration Si substrate; 12 is a GaAs epitaxial layer; 2 is an insulating layer; 3 is a piezoelectric film; 4 is a gate electrode; 5 is interdigital electrodes op an input transducer; 6 is a rear electrode; 7 is an input terminal; and 8 is an output terminal.

Figure 10:
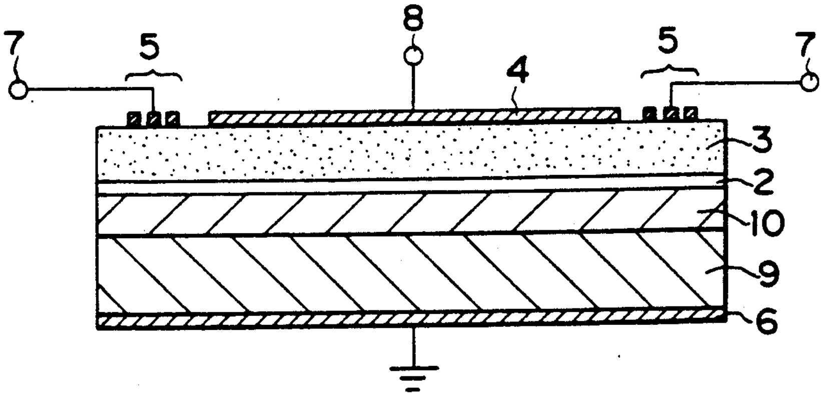
FIG. 10 PRIOR ART

Although the structure described above is similar to the prior art structure indicated in FIG. 10, in the structure indicated in FIG. 1, the high impurity concentration semiconductor (Si) substrate 11 and the semiconductor (GaAs) epitaxial layer 12 are made of different materials, while in the structure indicated in FIG. 10, the high impurity concentration semiconductor substrate 9 and a low impurity concentration semiconductor epitaxial layer 10 are made of a same material. This is the point, where they differ foundamentally from each other.

In this case, as described previously, in the structure indicated in FIG. 1, since the epitaxial layer and the substrate differ in the material, lattice constants thereof are different from each other and thus a hetero junction is formed therebetween, while in the prior art structure the epitaxial layer and the substrate have a same lattice constant and thus they form a homo junction. That is, the structure indicated in FIG. 1, a high impurity concentration Si substrate is used for the substrate and a GaAs epitaxial layer is used for the epitaxial layer. The formation of the GaAs epitaxial layer on the Si substrate can be realized by techniques, which are being established recently, such as MOCVD, optical CVD, MBE, etc. or by a technique, which is a combination thereof.

The graphs indicated in FIGS. 2 to 6 show examples, where characteristics obtained in the case of the structure A indicated in FIG. 1 according to the present invention are compared with those obtained in the case of the prior art structure B (refer to FIG. 10). They relate to the following structures:

Prior art structure:
gate electrode . . . Al
piezoelectric film . . . ZnO (5 μm)
insulating layer . . . $SiO_2$ (0.1 μm)
epitaxial layer . . . n-Si ($Nd=5\times10^{14}$ $cm^{-3}$)
substrate . . . n+-Si ($Nd=1\times10^{18}$ $cm^{-3}$)

Structure according to the present invention
gate electrode . . . Al
piezoelectric layer . . . ZnO (5 μm)
insulating layer . . . $SiO_2$ (0.1 μm)
epitaxial layer . . . n-GaAs ($Nd=5\times10^{14}$ $cm^{-3}$)
substrate . . . n+-Si ($Nd=1\times10^{18}$ $cm^{-3}$)

where Nd represents the impurity (donor) concentration of the respective semiconductor layer. Further numerical values such as 5 μm and 0.1 μm represent thicknesses of respective layers.

The graphs indicated in FIGS. 2 to 6 indicate results obtained by simulation representing characteristics, in the case where the frequency of the input signal is 215 MHz. Concerning calculation formulas for the simulation, refer to two following literatures:

Literature [6]

S. Mitsutsuka et al. "Propagation loss of surface acoustic waves on a monolithic metal-insulator-semiconductor structure" Journal of Appl. Phys., vol. 65, No. 2, January 1989, pp. 651-661.

Literature [7]

S. Minagawa, et al. "Efficient monolithic ZnO/Si Sezawa Wave Convolver", 1982 Ultrasonics Symp. Proc., IEEE Cat. #82CH1823-4 1982, pp. 447-451.

Figure 2:
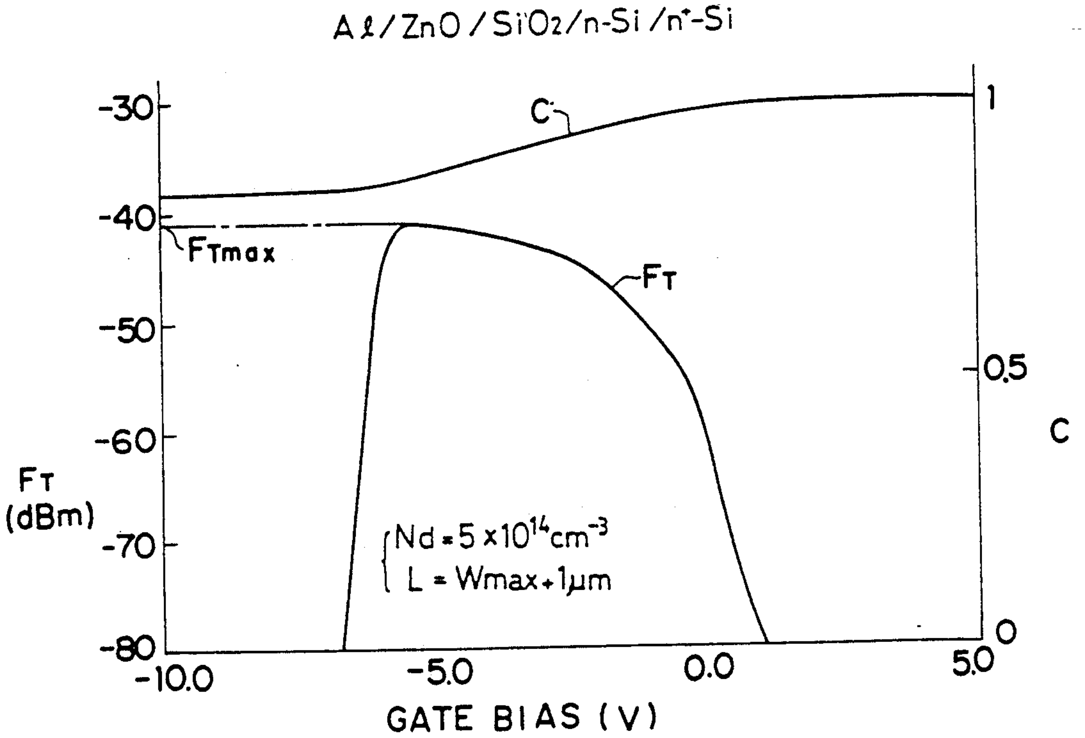
FIG. 2 is a graph indicating bias characteristics of the convolution efficiency for the prior art structure.
Figure 3:
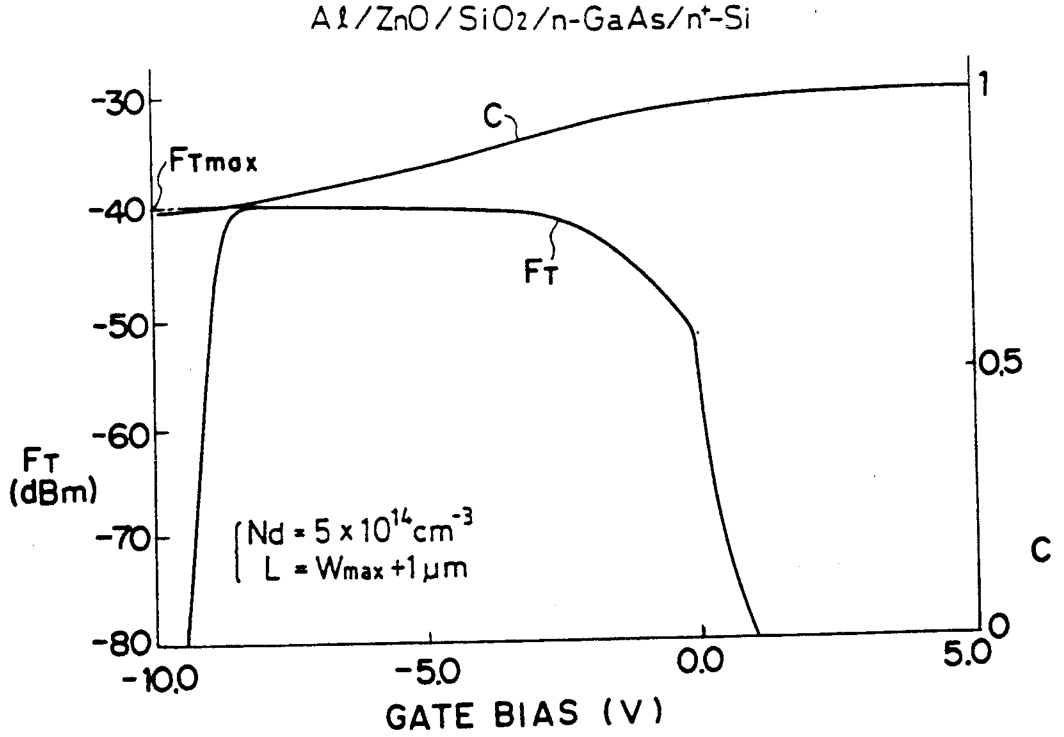
FIGS. 3, 12 and 19 are graphs indicating bias characteristics of the convolution efficiency for the embodiments indicated in FIGS. 1, 11 and 18, respectively.

The graphs indicated in FIG. 2 and 3 show comparisons of bias characteristics of the convolution efficiency $F_T$. In the Figure, the C-V characteristics (relation between the capacitance C between the gate electrode and the ground and the gate bias applied to the gate) are also shown for reference. In the Figure, the case where the thickness L of the epitaxial layer is $W_{max}+1$ μm is shown. Here Wmax represents the maximum width of the depletion layer, which takes following values at the room temperature, when $Nd=5\times10^{14}$ $cm^{-3}$:

$$W_{max} = \left\{ \begin{array}{ll} 1.2\ \mu m & (Si) \\ 1.7\ \mu m & (GaAs) \end{array} \right\} \quad (1)$$

Comparing the graphs indicated in FIGS. 2 and 3 with each other, it can be understood that not only the maximum value $F_T$ max of the convolution efficiency $F_T$ is slightly greater, but also the bias region where the convolution efficiency $F_T$ is great is wider in the structure A according to the present invention than in the prior art structure B. It indicates also that in the case of the structure according to the present invention, the convolution efficiency $F_T$ keeps a satisfactory value, even if the bias is more or less deviated. Also from this point of view the present invention is more advantageous than the prior art structure B.

Figure 4:
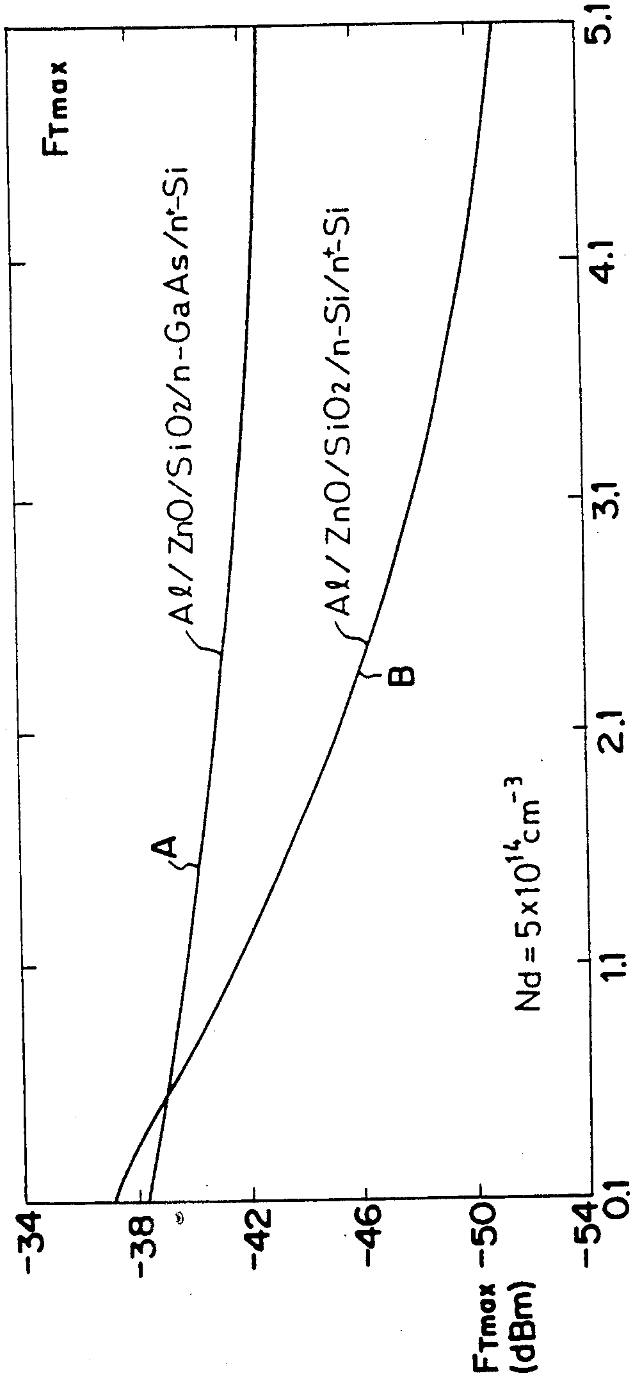
FIGS. 4, 13 and 20 are graphs indicating relations between the film thickness of the epitaxial layer and the maximum value of the convolution efficiency in the embodiments indicated in FIGS. 1, 11 and 18, respectively.

The graph indicated in FIG. 4 represents the relation between the thickness L of the epitaxial layer and the maximum value $F_T$max of the conversion efficiency $F_T$. The abscissa represents L-Wmax. It can be seen from this graph that in the structure A according to the present invention, the L dependence of $F_T$max is small and $F_T$ max is reduced only by about 4 dBm, even if the thickness L of the epitaxial layer is increased by about 5 μm (when the gate length is 40 mm), while in the prior art structure B, $F_T$ max decreases rapidly, when the thickness L of the epitaxial layer increases. This indicates that when n-GaAs is used for the epitaxial layer, as according to the present invention, even if there are many or few fluctuations in the thickness L of the epitaxial layer, this gives rise to no great difference in $F_T$ max and therefore for this reason it is possible to increase the fabrication yield.

Figure 5:
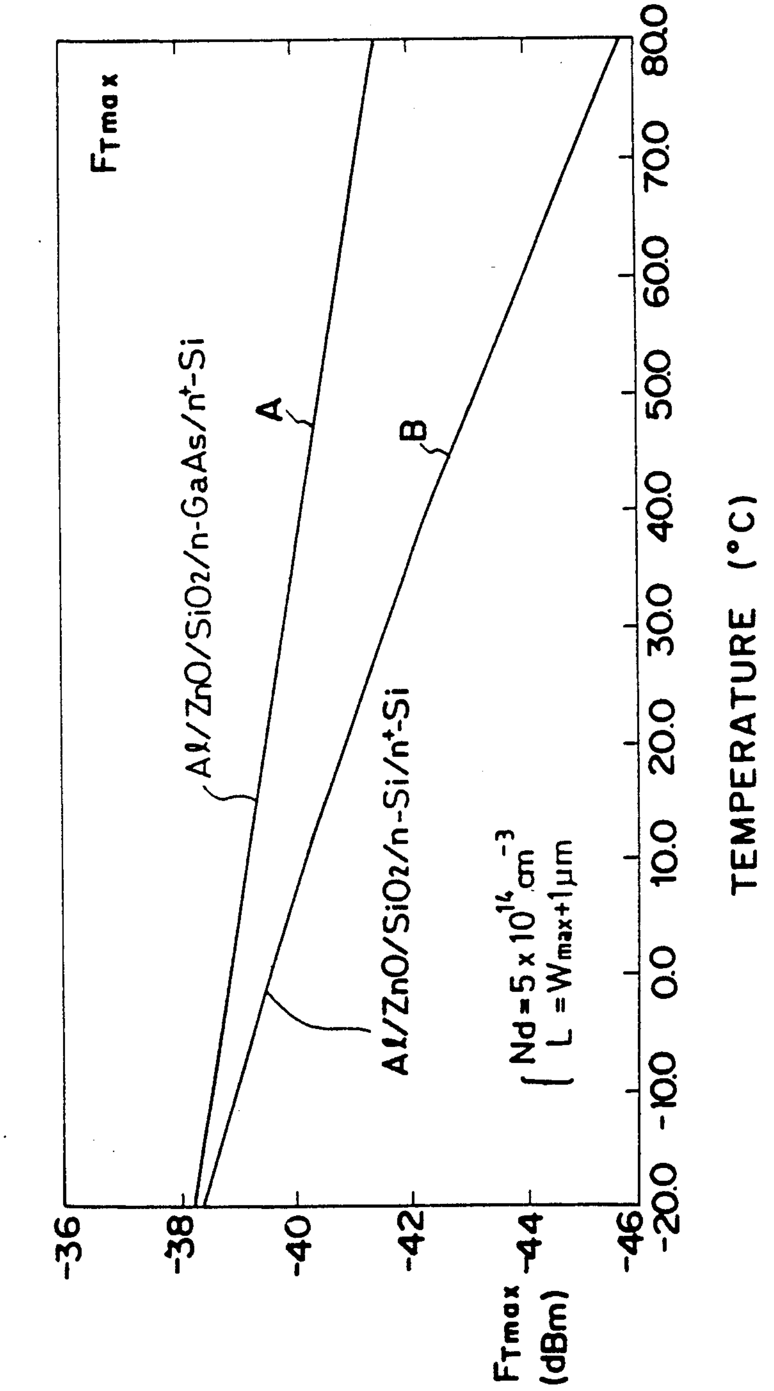
FIGS. 5, 14 and 21 are graphs indicating the comparison of the temperature dependence of the maximum value of the convolution efficiency in the embodiments indicated in FIGS. 1, 11 and 18, respectively, with that obtained by the prior art structure.
Figure 6:
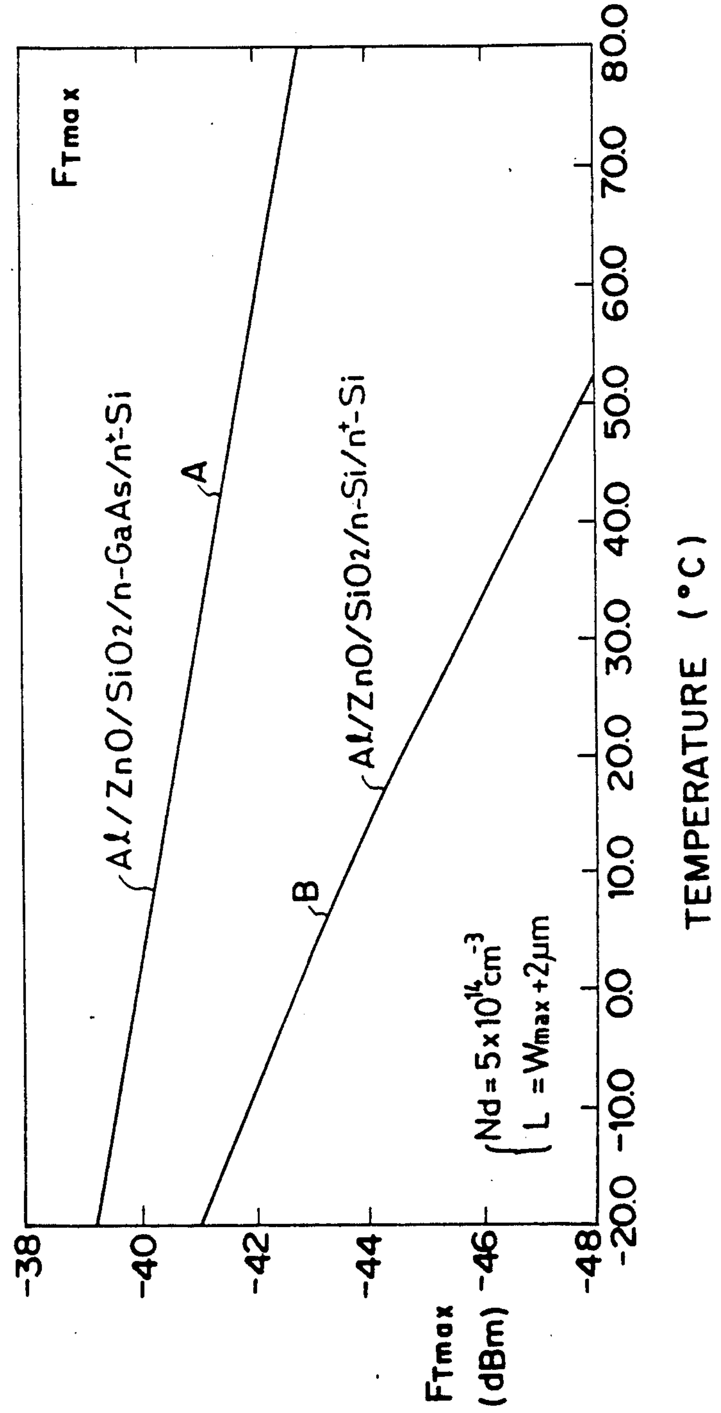
FIGS. 6, 15 and 22 are graphs indicating the comparison of the temperature dependence of the maximum value of the convolution efficiency in the embodiments indicated in FIGS. 1, 11 and 18, respectively, with that obtained by the prior art structure (the epitaxial layers being different from those used for FIGS. 5, 14 and 21.

The graphs indicated in FIGS. 5 and 6 show comparisons of the temperature dependence of $F_T$max. It can be understood from these graphs that the temperature dependence of $F_T$ max is clearly smaller and therefore the temperature characteristics are better for the structure A according to the present invention than for the prior art structure B. In particular, it can be seen that the L dependence of the temperature characteristics is fairly smaller for the structure A according to the present invention than for the prior art structure, while in the prior art structure B the temperature characteristics are significantly worsened, when the thickness L of the epitaxial layer is only slightly increased. Also from this point of view it is shown that fluctuations in the temperature characteristics are small, even if there are many of few fluctuations in the thickness L of the epitaxial layer and that the present invention is useful for increasing the fabrication yield.

As shown by the graphs indicated in FIGS. 2 to 6 described above, according to the present invention, it is possible to obtain an SAW convolver having a high convolution efficiency $F_T$ and excellent temperature characteristics, capable of increasing the fabrication yield.

For the graphs indicated in FIGS. 2 to 6, it is supposed that the GaAs substrate and the Si substrate are of n conductivity type. As described above, in order to realize the present invention, it is advantageous to use an n conductivity type semiconductor. This is because for GaAs it is not holes but electrons that have carrier mobility greater than that of Si. Denoting the mobility of electrons by μe and the mobility of holes by μh, an example of numerical values is cited below:

$$\mu e \approx \left\{ \begin{array}{ll} 1300\ \mathrm{cm^2/VS} & (\mathrm{Si}) \\ 3000 \sim 8500\ \mathrm{cm^2/VS} & (\mathrm{GaAs}) \end{array} \right\} \quad (2)$$

$$\mu h \approx \left\{ \begin{array}{ll} 600\ \mathrm{cm^2/VS} & (\mathrm{Si}) \\ 380\ \mathrm{cm^2/VS} & (\mathrm{GaAs}) \end{array} \right\} \quad (3)$$

As it can be seen in the example of numerical values described above, when majority carriers are electrons, a greater mobility is obtained and loss in the epitaxial layer is smaller. This is the reason why it is advantageous to use n conductivity type GaAs and n conductivity type Si.

Although the graphs indicated in FIGS. 2 to 6 show examples, for which ZnO is used for the piezoelectric film, AlN may be also used therefor. Further SiN and $Al_2O_3$ other than SiO can be used for the insulating film.

These insulating films can be formed by the sputtering method, the CVD method, etc. Furthermore, it is possible also to form a GaxAsyOz film on the surface of GaAs to obtain an insulating film by anode-oxidizing the GaAs/Si substrate.

Figure 7:
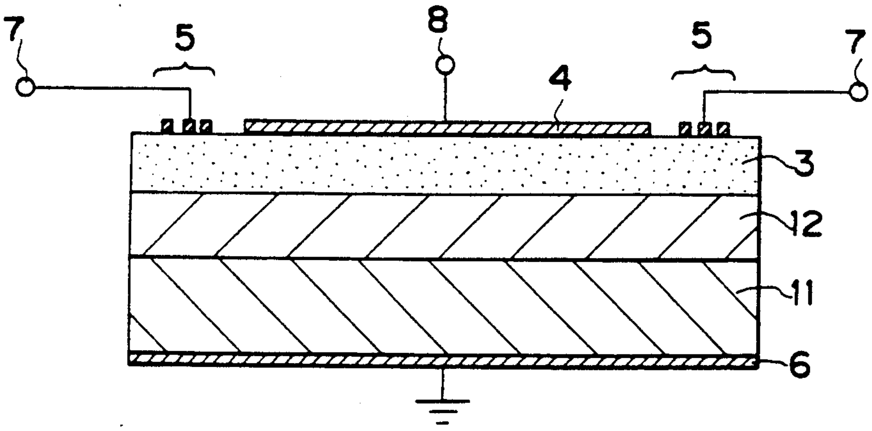
FIGS. 7, 16 and 23 are cross-sectional views of monolithic SAW convolvers, which are other embodiments of the present invention.

Although in the above, the case of the structure indicated in FIG. 1 is described, in principle, as indicated in FIG. 7, a structure, in which the insulating film 2 is removed from the structure indicated in FIG. 1, may be also adopted. The insulating film in the structure indicated in FIG. 1 is disposed for stabilizing MOS characteristics of semiconductor and from the point of view of the foundamental operation of the convolver, if a depletion layer is stably formed in the semiconductor, basically absence or presence of the insulating layer has almost no influences on the convolution efficiency $F_T$. Consequently, if the piezoelectric film 3 has a satisfactory insulating property, a structure including no insulating film may be used, as indicated in FIG. 7.

Figure 8:
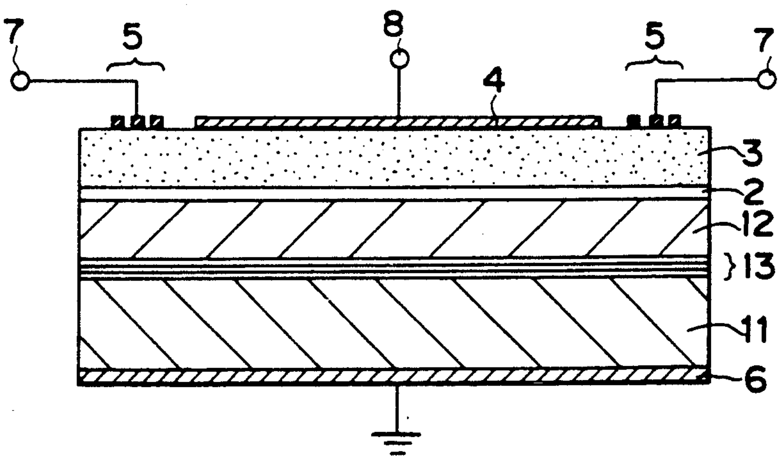
FIGS. 8, 17 and 24 are cross-sectional views of monolithic SAW convolvers, which are still other embodiments of the present invention.
Figure 9:
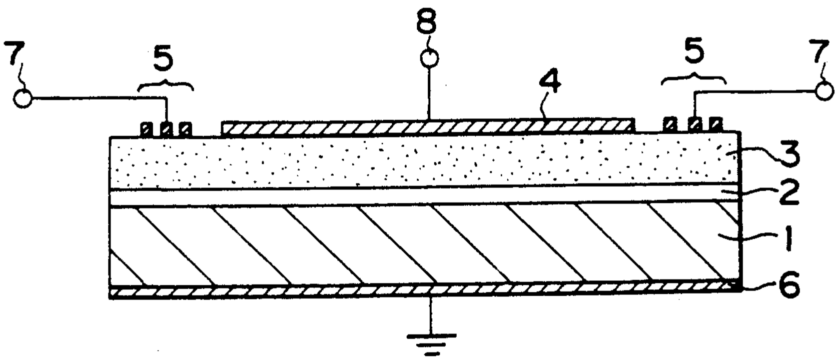
FIG. 9 PRIOR ART
FIGS. 9 and 10 are cross-sectional views indicating the structure of prior art SAW convolvers.

In the structures according to the present invention indicated in FIGS. 1 and 7, a distorted superlattice film may be disposed at the interface of GaAs/high impurity concentration Si in order to improve the crystallinity of the GaAs epitaxial layer. FIG. 8 shows this structure, in which a distorted superlattice film 13 is added to the structure indicated in FIG. 1. Since this distorted superlattice film 13 is extremely thin, it has almost no influences on the characteristics of the convolver. However, as described previously, since the crystallinity of the GaAs epitaxial layer is improved, it can be expected that the stability of the element characteristics is increased, which contributes to increase of the fabrication yield. It is a matter of course that the distorted superlattice film can be applied to the structure indicated in FIG. 7.

Figure 11:
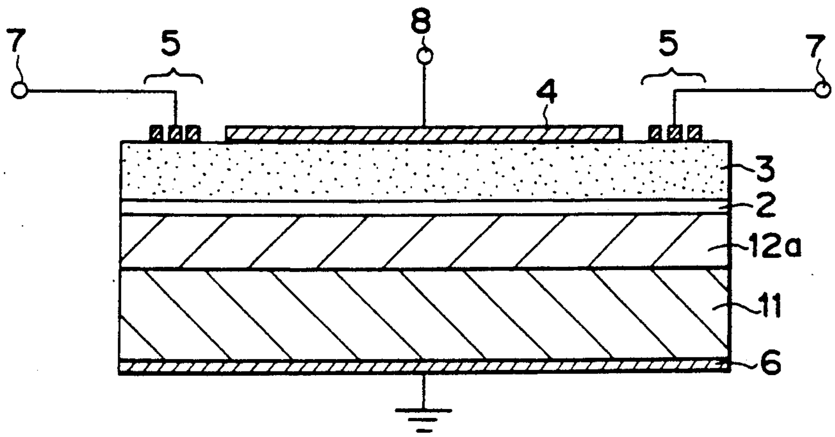
Figure 16:
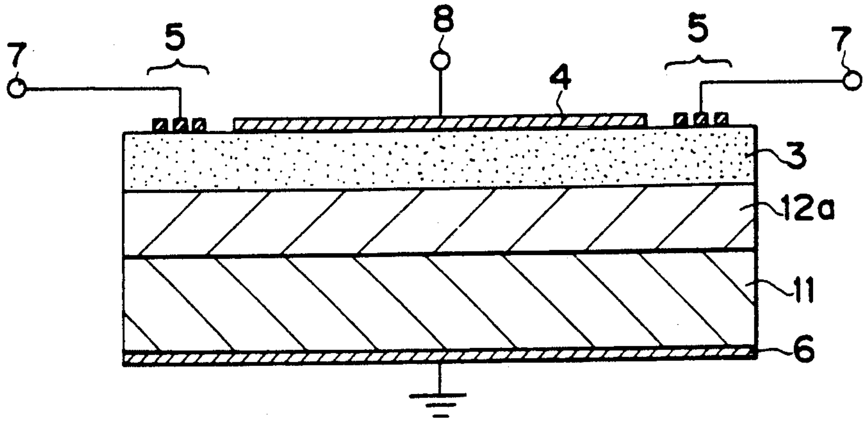
Figure 17:
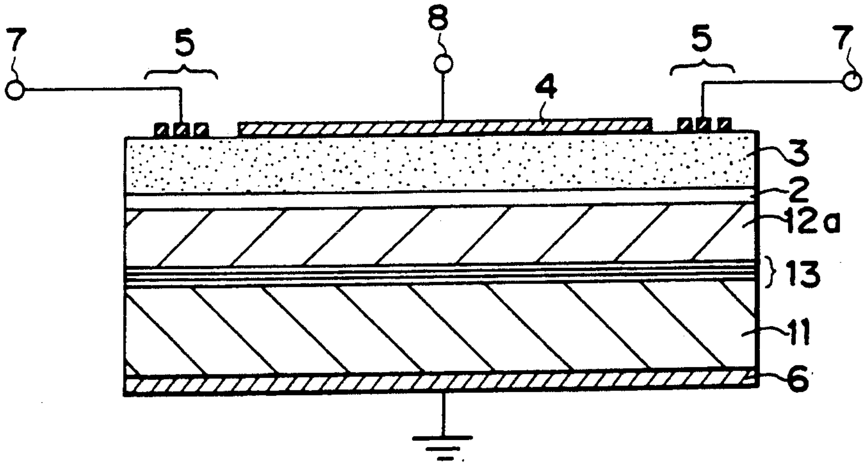

FIGS. 11, 16 and 17 show other embodiments of the present invention corresponding to the embodiments indicated in FIGS. 1, 7 and 8, respectively, in which 12a represents a Ga(1−x)AlxAs epitaxial layer and the other reference numerals are identical to those used in the embodiments described previously. Here x represents the Al component ratio (mixed crystal ratio).

FIGS. 12 to 15 show graphs comparing the characteristics of the structure A according to the present invention indicated in FIG. 11 with the characteristics of the prior art structure B (refer to FIG. 10), in which the prior art structure B is identical to that described previously, and the structure A according to the present invention is as follows:

gate electrode . . . Al
piezoelectric film . . . ZnO (5 μm)
insulating film . . . $SiO_2$ (0.1 μm)
epitaxial layer . . . n-Ga(1−x)AlxAs ($Nd=5\times10^{14}$ $cm^{-3}$)
substrate . . . $n^+$-Si ($Nd=1\times10^{18}$ $cm^{-3}$)

FIGS. 12 to 15 show examples, in the case where the component ratio x=0.1.

Figure 14:
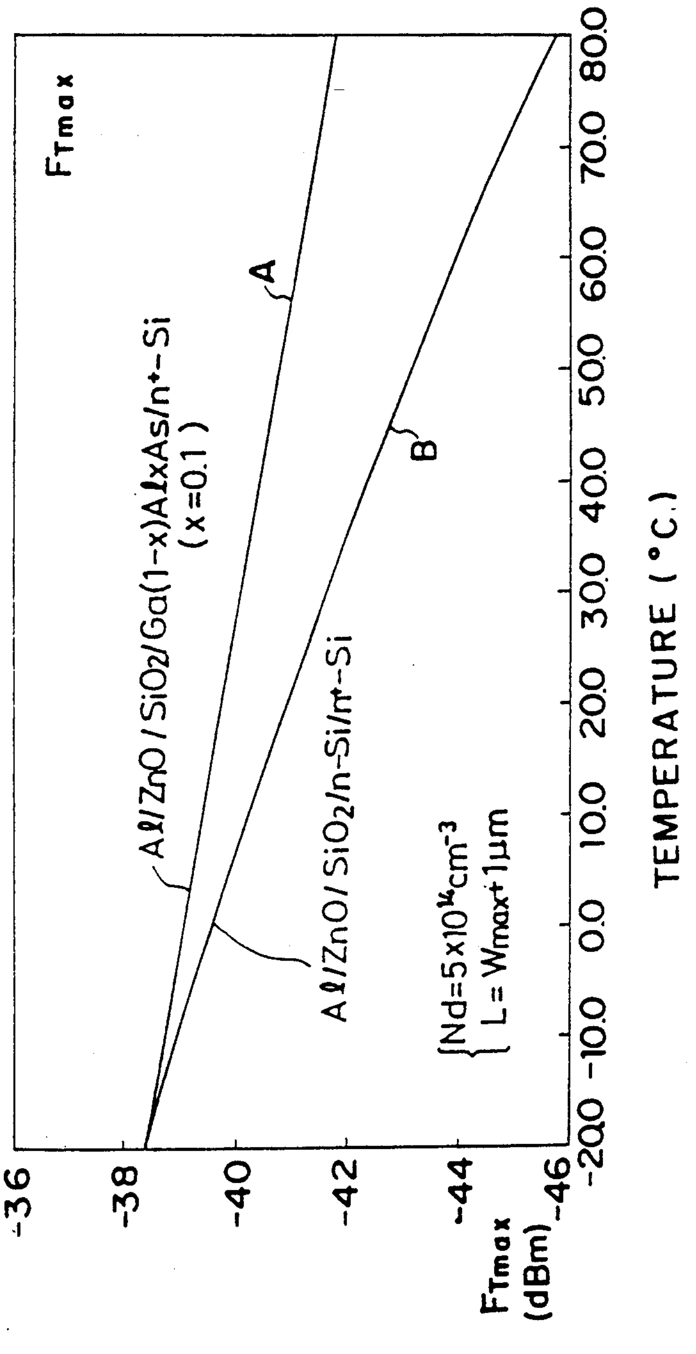
Figure 15:
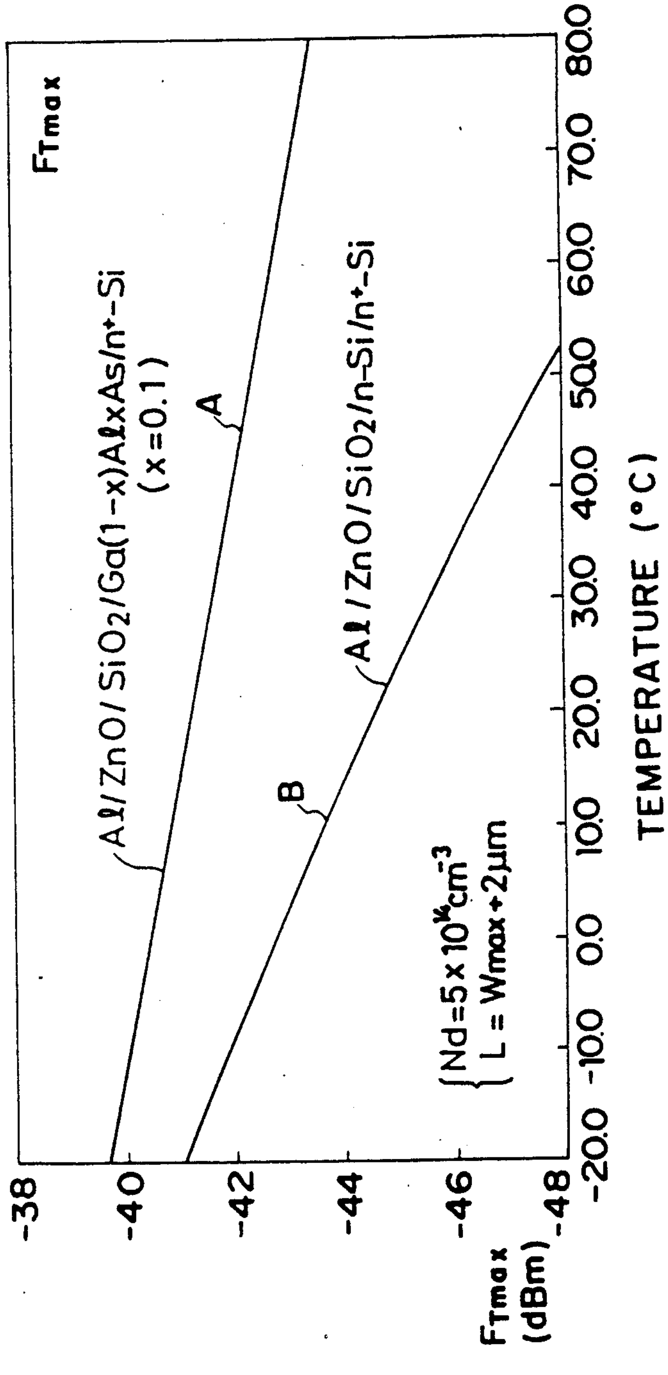

Further, it s in the case where the Al component ratio x is in a region defined by:

$$0<x\leqq0.4 \quad (4)$$

that the electron mobility for Ga(1−x)AlxAs is greater than that for Si in Equation (2). Consequently it is disirable that, in the embodiment described above, the Al component ratio x is in the region defined by $0<x\leqq0.4$, as indicated by the inequality (4). When x is greater than 0.4, $\mu e$ is smaller than that for Si. In such a case it cannot be expected to increase the convolution efficiency $F_T$ and to improve the temperature characteristics. However, since the band gap of Ga(1−x)AlxAs is wider than that of Si, an advantage remains that the bias region, where a satisfactory convolution efficiency can be obtained, is extended, as indicated in FIG. 14.

Figure 12:
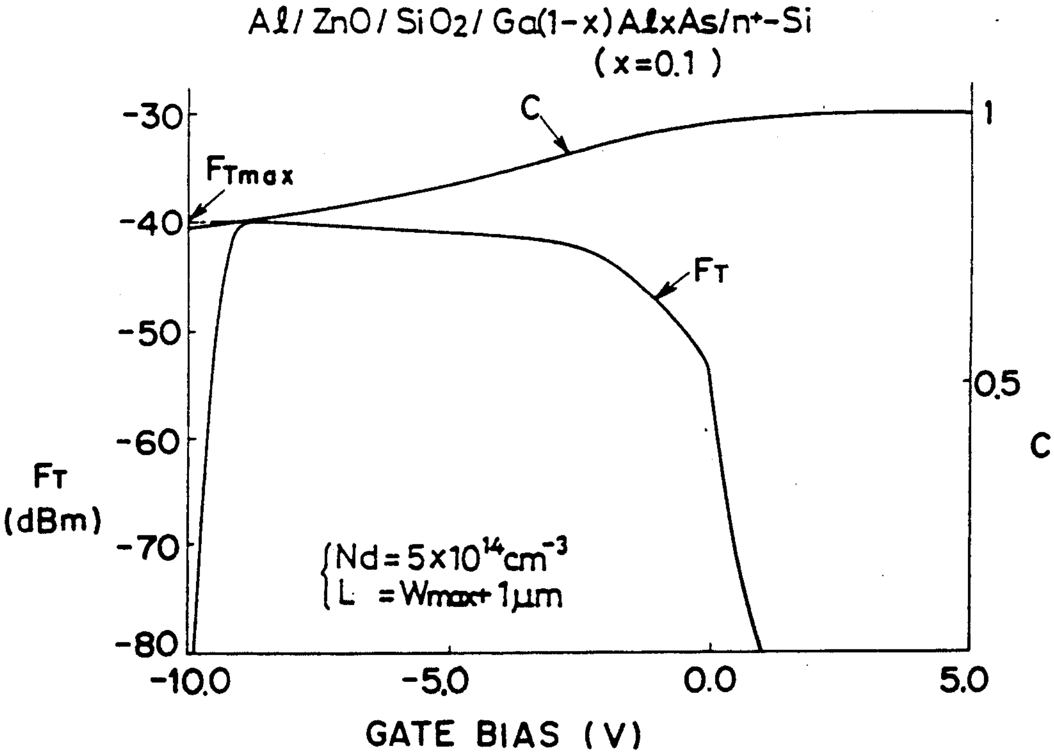
Figure 13:
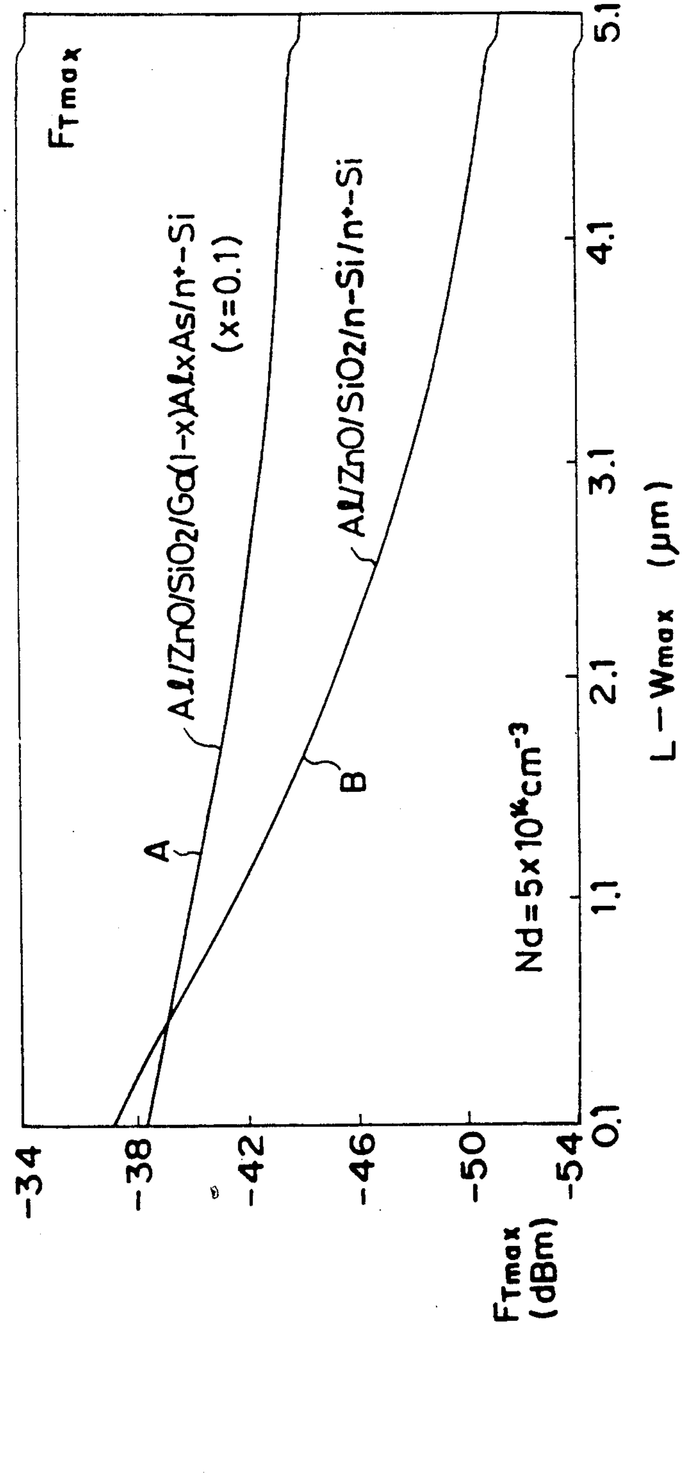

In FIG. 12, following values are valid:

$$W\max = \begin{Bmatrix} 1.2\ \mu m & (Si) \\ 1.78\ \mu m & (Ga(1-x)AlxAs) \end{Bmatrix} \quad (5)$$

$$x = 0.1$$

The extent of the bias region, as indicated in FIG. 12, is caused by the fact that the band gap of Ga(1−x)AlxAs is wider than that of Si and an inversion layer is more hardly produced for the former. That is, the increase in the band gap can be cited as one of the reasons why it is advantageous to use Ga(1−x)AlxAs instead of Si.

$\mu e$ and $\mu h$ are given by:

$$\mu e \approx \begin{Bmatrix} 1300\ cm^2/VS & (Si) \\ 130000 \sim 16000\ cm^2/VS & (Ga(1-x)AlxAs) \end{Bmatrix} \quad (6)$$

(where $0 < x \leqq 0.4$)

$$\mu h \approx \begin{Bmatrix} 600\ cm^2/VS & (Si) \\ 200 \sim 400\ cm^2/VS & (Ga(1-x)AlxAs) \end{Bmatrix} \quad (7)$$

Figure 18:
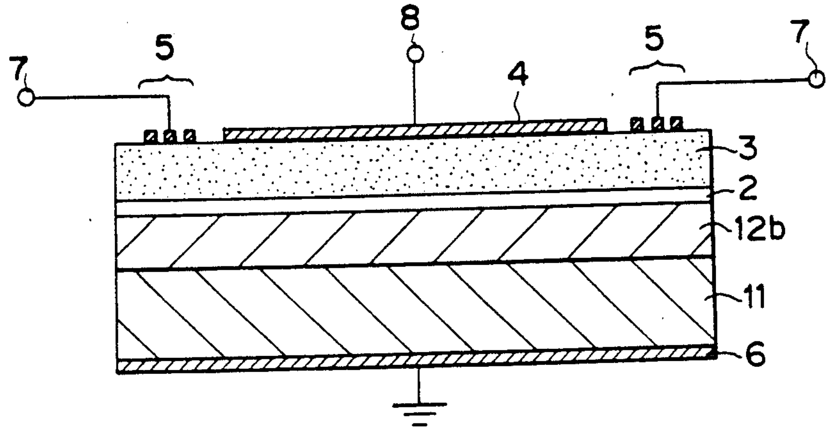
Figure 19:
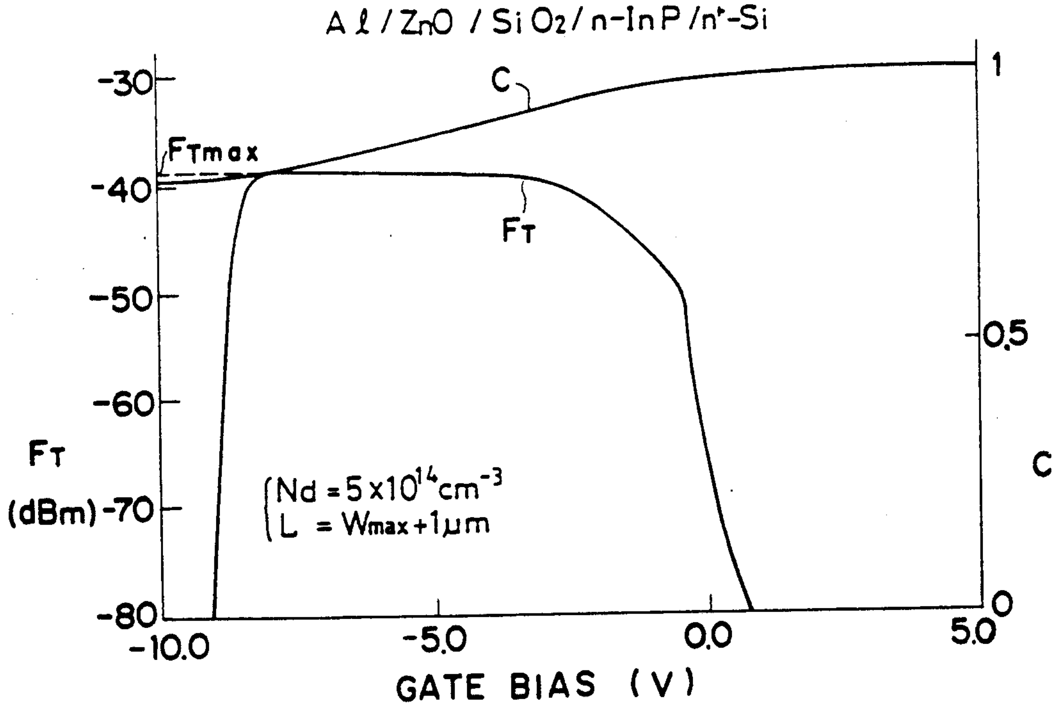
Figure 20:
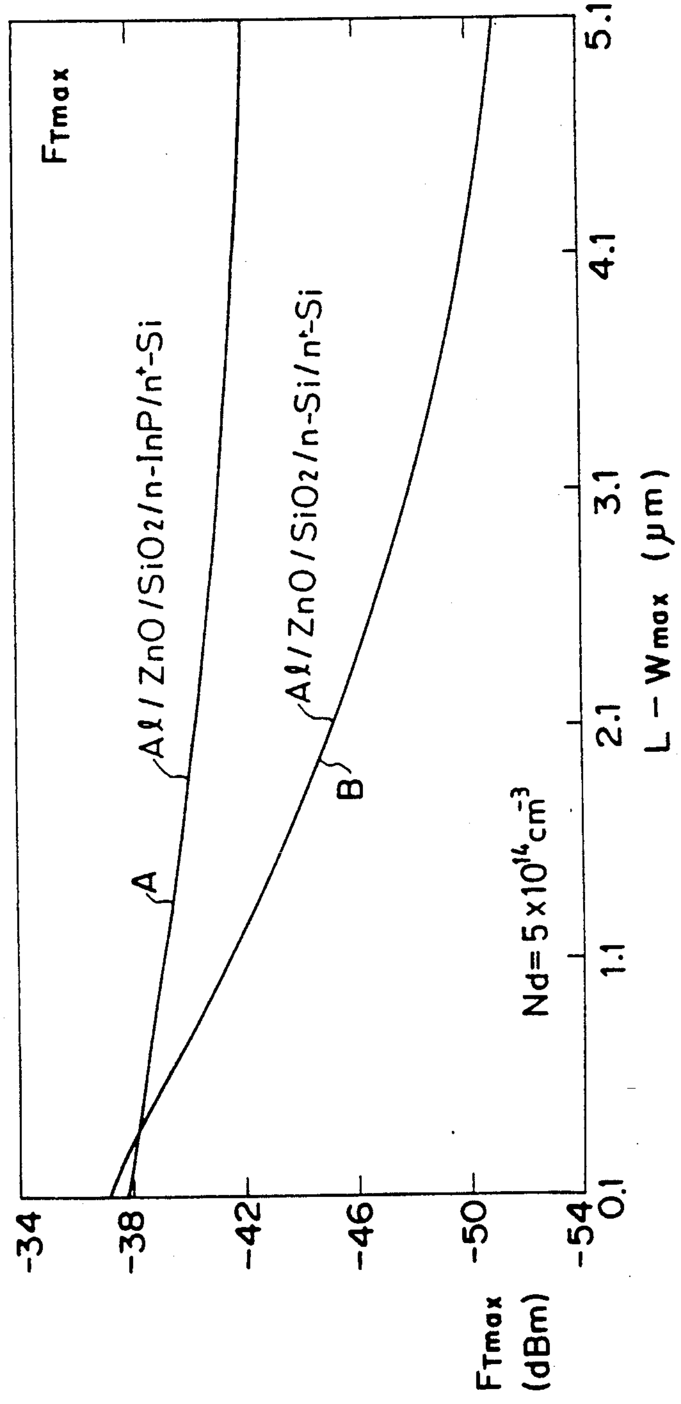
Figure 21:
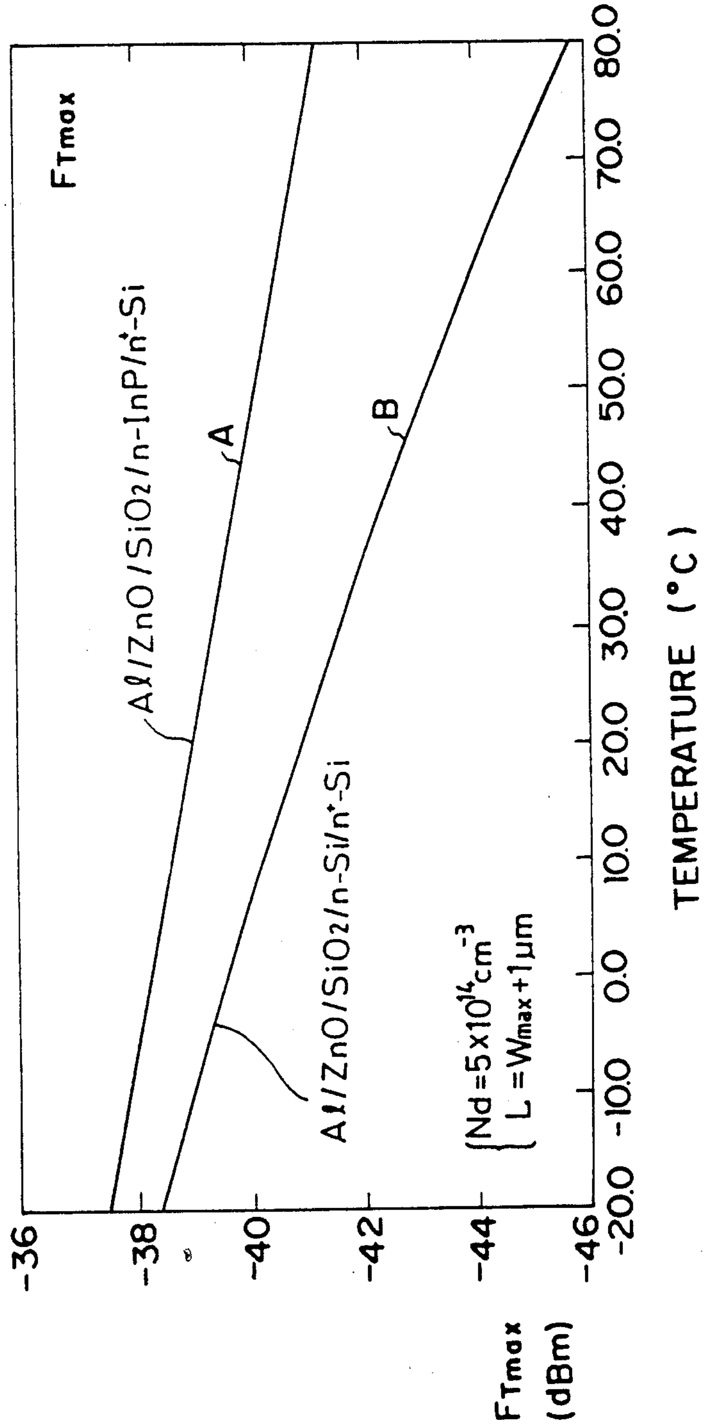
Figure 22:
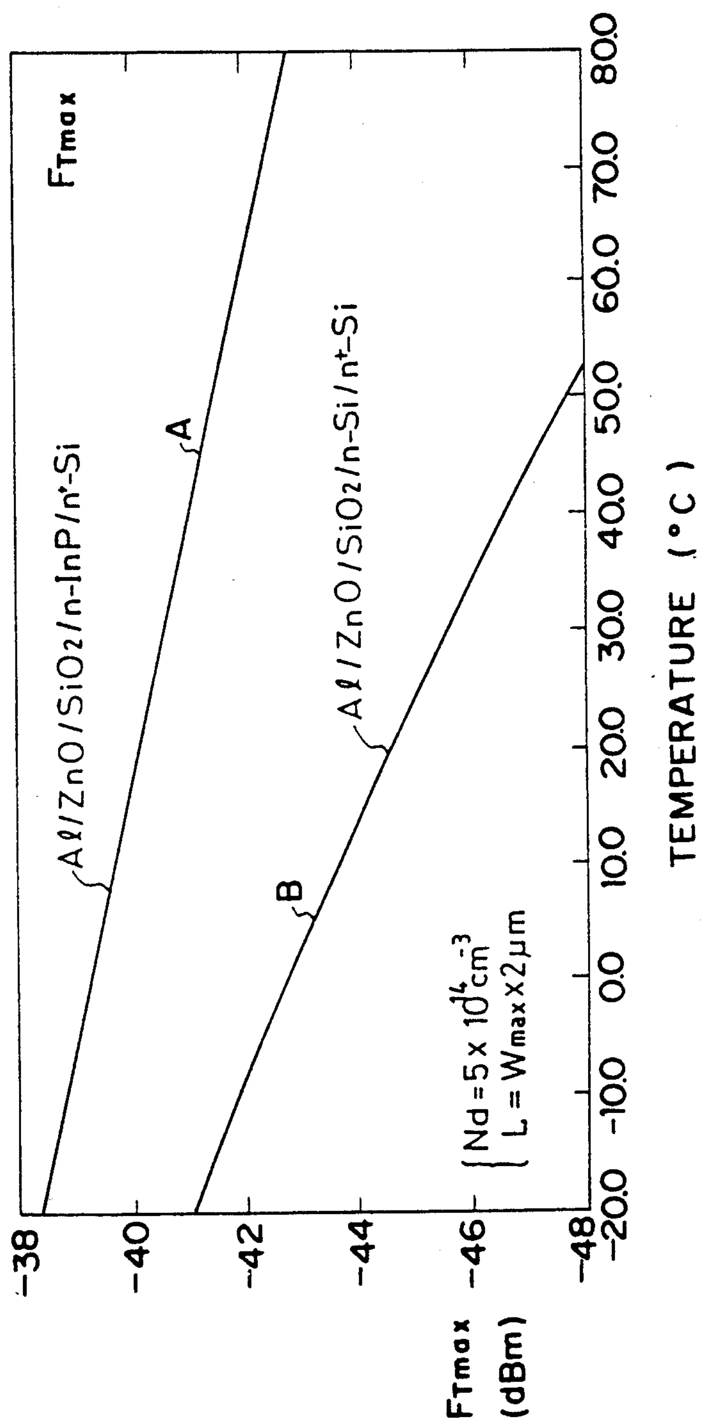
Figure 23:
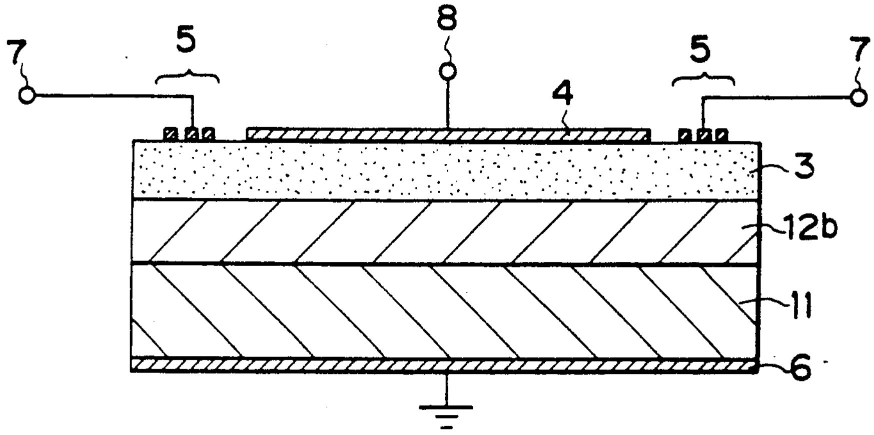
Figure 24:
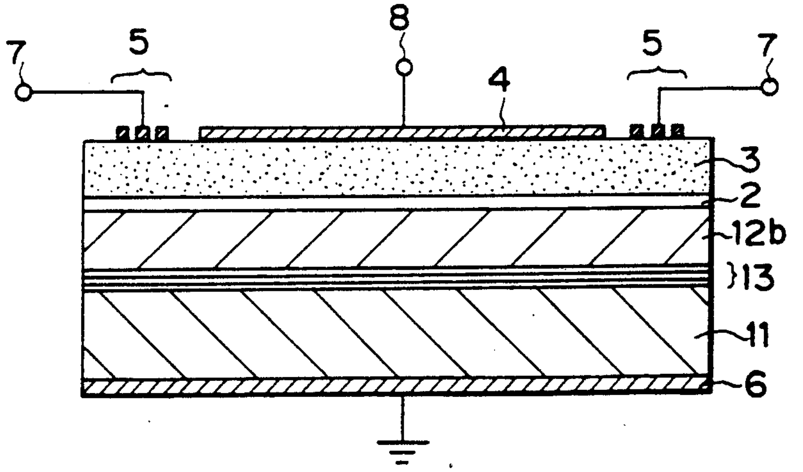

FIGS. 18, 23 and 24 show still other embodiments of the present invention corresponding to FIGS. 1, 7 and 8, respectively, in which **12*b*** represents an InP epitaxial layer and the other reference numerals are identical to those used in the embodiments described previously.

FIGS. 19 to 22 show graphs comparing the characteristics of the structure A according to the present invention indicated in FIG. 18 with the characteristics of the prior art structure B (refer to FIG. 10), in which the prior art structure B is identical to that described previously and the structure A according to the present invention is as follows:

gate electrode . . . Al
piezoelectric film . . . ZnO (5 $\mu$m)
insulating film . . . $SiO_2$ (0.1 $\mu$m)
epitaxial layer . . . InP ($Nd = 5 \times 10^{14}\ cm^{-3}$)
substrate . . . $n^+$-Si ($Nd = 1 \times 10^{18}\ cm^{-3}$)

In FIG. 18, following values are valid $$W\max = \begin{Bmatrix} 1.2\ \mu m & (Si) \\ 1.58\ \mu m & (InP) \end{Bmatrix} \quad (8)$$

$\mu e$ and $\mu h$ are given by:

$$\mu e \approx \begin{Bmatrix} 1300\ cm^2/VS & (Si) \\ 4000 \sim 6000\ cm^2/VS & (InP) \end{Bmatrix} \quad (9)$$

-continued $$\mu h \approx \begin{Bmatrix} 600\ cm^2/VS & (Si) \\ 150\ cm^2/VS & (InP) \end{Bmatrix} \quad (10)$$

In the different embodiments described above the input transducers may be disposed under the piezoelectric film 3.

As described above, according to the present invention, it is possible to obtain an SAW convolver having a high convolution efficiency, excellent temperature characteristics, and a high fabrication yield, compared with a monolithic SAW convolver having the prior art structure.

Further, the SAW convolver according to the present invention can be applied to all sorts of apparatuses using SAW convolvers. Concretely speaking, it can be widely applied to a spread spectrum communication apparatus, a correlator, a radar, image processing, a Fourier transformer, etc.

What is claimed is:

1. A surface acoustic wave convolver comprising:
a high impurity concentration Si substrate;
a GaAs epitaxial layer formed on said substrate;
a piezoelectric film formed on said GaAs epitaxial layer; and
input transducers and an output gate formed in contact with said piezoelectric film.

2. A convolver according to claim 1 wherein a distorted superlattice film is disposed at the interface between said high impurity concentration Si substrate and said GaAs epitaxial layer.

3. A convolver according to claim 1 wherein an insulating film is formed between said GaAs epitaxial layer and said piezoelectric film.

4. A convolver according to claim 1 wherein both said high impurity concentration Si substrate and said GaAs epitaxial layer are of n conductivity type.

5. A convolver according to claim 3 wherein a distorted superlattice film is disposed at the interface between said high impurity concentration Si substrate and said GaAs epitaxial layer.

6. A convolver according to claim 3 wherein both said high impurity concentration Si substrate and said GaAs epitaxial layer are of n conductivity type.

7. A surface acoustic wave convolver comprising:
a high impurity concentration semiconductor substrate;
a Ga(1−x)AlxAs epitaxial layer formed on said substrate;
a piezoelectric film formed on said epitaxial layer; and
right and left input transducers and an output gate put therebetween, formed in contact with said piezoelectric film.

8. A convolver according to claim 7 wherein an insulating film is formed between said Ga(1−x)AlxAs epitaxial layer and said piezoelectric film.

9. A convolver according to claim 7 wherein a distorted superlattice film is disposed at the interface between said high impurity concentration semiconductor substrate and said Ga(1−x)AlxAs epitaxial layer.

10. A convolver according to claim 8 wherein a distorted superlattice film is disposed at the interface between said high impurity concentration semiconductor substrate and said Ga(1−x)AlxAs epitaxial layer.

11. A convolver according to claim 7 wherein both said high impurity concentration semiconductor substrate and said Ga(1−x)AlxAs epitaxial layer are of n conductivity type.

12. A convolver according to claim 8 wherein both said high impurity concentration semiconductor substrate and said Ga(1−x)AlxAs epitaxial layer are of n conductivity type.

13. A convolver according to claim 7 wherein the A component ratio x of said Ga(1−x)AlxAs epitaxial layer is in a region defined by $0<x\leqq 0.4$.

14. A convolver according to claim 8 wherein the A component ratio x of said Ga(1−x)AlxAs epitaxial layer is in a region defined by $0<x\leqq 0.4$.

15. A surface acoustic wave convolver comprising:

a high impurity concentration Si substrate;

an InP epitaxial layer formed on said substrate;

a piezoelectric film formed on said epitaxial layer; and input transducers and an output gate formed in contact with said piezoelectric film.

16. A convolver according to claim 15 wherein an insulating film is formed between said InP epitaxial layer and said piezoelectric film.

17. A convolver according to claim 15 wherein a distorted superlattice film is disposed at the interface between said high impurity concentration Si substrate and said InP epitaxial layer.

18. A convolver according to claim 16 wherein a distorted superlattice film is disposed at the interface between said high impurity concentration Si substrate and said InP epitaxial layer.

19. A convolver according to claim 15 wherein both said high impurity concentration Si substrate and said InP epitaxial layer are of n conductivity type.

20. A convolver according to claim 16 wherein both said high impurity concentration Si substrate and said InP epitaxial layer are of n conductivity type.

* * * * *

UNITED STATES PATENT AND TRADEMARK OFFICE
CERTIFICATE OF CORRECTION

PATENT NO. : 5,091,669
DATED : February 25, 1992
INVENTOR(S) : Syuichi MITSUTSUKA

It is certified that error appears in the above-identified patent and that said Letters Patent is hereby corrected as shown below:

On the title page, immediately below the line in the left column which sets forth the filing date, please add the following:

---[30] Foreign Application Priority Data
May 31, 1990 [JP] Japan...2-142749
June 8, 1990 [JP] Japan...2-150334
September 12, 1990 [JP] Japan...2-243363---.

Column 2, line 59; replace "Ga(1-x)AlxAs" with ---Ga(1-x)AℓxAs---.
line 61; replace "Ga(1-x)AlxAs" with ---Ga(1-x)AℓxAs---.
Column 4, line 10; replace "Al" with ---Aℓ---.
line 16; replace "Al" with ---Aℓ---.
Column 5, line 67; replace "AlN" with ---AℓN---.
line 68; replace "$Al_2O_3$" with ---$Aℓ_2O_3$---.
Column 6, line 40; replace "Ga(1-x)AlxAs" with ---Ga(1-x)AℓxAs---.
line 43; replace "Al" with ---Aℓ---.
line 51; replace "Al" with ---Aℓ---.

UNITED STATES PATENT AND TRADEMARK OFFICE

CERTIFICATE OF CORRECTION

PATENT NO. : 5,091,669

DATED : February 25, 1992

INVENTOR(S) : Syuichi MITSUTSUKA

It is certified that error appears in the above-identified patent and that said Letters Patent is hereby corrected as shown below:

Column 6, line 54; replace "Ga(1-x)AlxAs" with ---Ga(1-x)AℓxAs---.

line 59; replace "Al" with ---Aℓ---.

line 64; replace "Ga(1-x)AlxAs" with ---Ga(1-x)AℓxAs---.

line 66; replace "Al" with ---Aℓ---.

Column 7, line 4; replace "Ga(1-x)AlxAs" with ---Ga(1-x)AℓxAs---.

line 13; replace "Ga(1-x)AlxAs" with ---Ga(1-x)AℓxAs---.

line 19; replace "Ga(1-x)AlxAs" with ---Ga(1-x)AℓxAs---.

line 29; replace "Ga(1-x)AlxAs" with ---Ga(1-x)AℓxAs---.

line 35; replace "Ga(1-x)AlxAs" with ---Ga(1-x)AℓxAs---.

line 50; replace "Al" with ---Aℓ---.

Column 8, line 51; replace "Ga(1-x)AlxAs" with ---Ga(1-x)AℓxAs---.

line 59; replace "Ga(1-x)AlxAs" with ---Ga(1-x)AℓxAs---.

UNITED STATES PATENT AND TRADEMARK OFFICE
CERTIFICATE OF CORRECTION

PATENT NO. : 5,091,669

DATED : February 25, 1992

INVENTOR(S) : Syuichi MITSUTSUKA

It is certified that error appears in the above-identified patent and that said Letters Patent is hereby corrected as shown below:

Column 8, line 64; replace "Ga(1-x)AlxAs" with ---Ga(1-x)AℓxAs---.

line 68; replace "Ga(1-x)AlxAs" with ---Ga(1-x)AℓxAs---.

Column 9, line 3; replace "Ga(1-x)AlxAs" with ---Ga(1-x)AℓxAs---.

line 7; replace "Ga(1-x)AlxAs" with ---Ga(1-x)AℓxAs---.

Column 9, line 10; replace "Ga(1-x)AlxAs" with ---Ga(1-x)AℓxAs---.

line 13; replace "Ga(1-x)AlxAs" with ---Ga(1-x)AℓxAs---.

Signed and Sealed this

Twentieth Day of July, 1993

*Attest:*

Michael K. Kirk

MICHAEL K. KIRK

*Attesting Officer*

*Acting Commissioner of Patents and Trademarks*